(12) United States Patent
Natarajan et al.

(10) Patent No.: US 6,194,053 B1
(45) Date of Patent: Feb. 27, 2001

(54) APPARATUS AND METHOD FABRICATING BURIED AND FLAT METAL FEATURES

(75) Inventors: Govindarajan Natarajan, Pleasant Valley; Edward James Pega, Hopewell Junction, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/031,234

(22) Filed: Feb. 26, 1998

(51) Int. Cl.[7] ............................................. H01R 12/06
(52) U.S. Cl. ..................... 428/139; 428/140; 428/131; 428/901; 428/472; 428/472.1; 174/264; 174/265; 29/852; 29/853; 427/97; 361/765; 361/766; 361/778
(58) Field of Search ...................... 428/139, 140, 428/131, 901, 472, 472.1; 174/264, 265; 29/852, 853; 427/97; 361/765, 766, 778

(56) References Cited

U.S. PATENT DOCUMENTS

| | | | |
|---|---|---|---|
| 5,024,883 | 6/1991 | SinghDeo et al. | 156/895 |
| 5,061,438 | * 10/1991 | Lillie et al. | 419/8 |
| 5,277,725 | * 1/1994 | Acocella et al. | 156/89 |
| 5,417,784 | 5/1995 | Kobayashi et al. | 156/64 |
| 5,480,503 | 1/1996 | Casey et al. | 156/89 |
| 5,502,013 | 3/1996 | James | 501/153 |
| 5,517,758 | * 5/1996 | Nakamura | 29/852 |
| 5,534,092 | 7/1996 | Ogawa et al. | 156/89 |
| 5,588,207 | * 12/1996 | Kawakita et al. | 29/852 |
| 5,640,761 | * 6/1997 | Distefano et al. | 29/830 |
| 5,835,357 | * 11/1998 | Swamy et al. | 361/764 |
| 5,860,818 | * 1/1999 | Sakaki et al. | 439/91 |

* cited by examiner

Primary Examiner—William P. Watkins, III
(74) Attorney, Agent, or Firm—Aziz M. Ahsan

(57) ABSTRACT

The present invention relates generally to a new method and apparatus to enable high yielding double sided and/or multipass screening in the manufacture of multilayer ceramic packages. Also, the present invention enables the screened features to be buried partially or fully with flat surface being available for high yielding post-sinter operations.

12 Claims, 2 Drawing Sheets

APPARATUS AND METHOD FABRICATING BURIED AND FLAT METAL FEATURES

FIELD OF THE INVENTION

The present invention relates generally to an apparatus and a method for forming buried metal features with a flat surface in single and/or laminated unfired structures and more particularly to an apparatus and a method for fabricating MLC (multilayer ceramic) products with buried metal features with a flat surface.

BACKGROUND OF THE INVENTION

Multilayer devices are becoming smaller and more dense with the evolution of new technology. The manufacturers of these types of products are therefore constantly challenged to improve their products. One way to improve would be to identify and eliminate defects. Whereas significant improvements are being made to eliminate systematic defects by reducing process variability. Process improvements alone are not sufficient to eliminate all the random defects which effect both yield and reliability. Historically, screening techniques have been employed to improve product failure rates to acceptable levels by culling out many of these random defects. Another way would be through innovation.

Multilayer ceramic (MLC) structures are primarily used in the production of electronic substrates and devices. However, the MLC products also find use in other areas of technology.

The MLCs can have various layering configurations and other features. For example, an MLC circuit substrate may comprise patterned metal layers which act as electrical conductors sandwiched in between ceramic layers which act as a dielectric medium. One or more of the ceramic layers have tiny holes which are also called via holes. Prior to lamination, the via holes are filled with electrically conductive metal paste and sintered to form vias which provide the electrical connection between the layers.

In addition, the MLC substrates may have termination pads for attaching semiconductor chips, connector leads, capacitors, resistors, etc.

Generally, conventional ceramic structures are formed from ceramic green sheets which are prepared from a slurry of ceramic particulate, thermoplastic polymer binders, plasticizers, and solvents. This composition is spread or cast into ceramic sheets or slips from which the solvents are subsequently volatilized to provide coherent and self-supporting flexible green sheets. After punching, metal paste screening, stacking and laminating, the green sheets are fired at temperatures sufficient to burn-off or remove the unwanted polymeric binder resin and sinter the ceramic particulate together into a densified ceramic substrate. Thus the present invention is directed to the screening, stacking and lamination steps of this process.

In the MLC packaging industry it is very common to use green sheets of various thicknesses. The thicknesses can typically vary from 6 mils to 30 mils and in general the art of punching and metallizing these layers are well known. Presently, green sheet thicknesses below 6 mils are very scarcely used. Handling, screening and stacking of green sheets thinner than 6 mils in general poses tremendous challenge. In fact the use of one to two mils green sheets which are punched and screened using traditional MLC technology are currently being invented.

Also, in the MLC packaging industry it is very common to use capacitor layers. The capacitance necessary in a package depends on the design and such capacitance is obtained by choosing proper dielectric layer thickness and metal area within a layer. The industry is striving for higher capacitance and since the metal area is maxing out for a given substrate size it is necessary to use thinner dielectric layers between electrodes to obtain the required capacitance. For example, as a rule of thumb one could double the capacitance for a given dielectric system and electrode metal area by decreasing the dielectric layer thickness by half. Additionally the number of layers needed for capacitance in a package as well is reduced by about 50 percent. Reduction in number of layers is a positive thing in terms of the cost of making the substrate.

The thickness of the thin sheets could be anywhere from 0.5 mil and above. Screening and stacking of thin sheets is very difficult with current technology as they tend to shrink a lot and distort. Furthermore, each layer may need several passes of screening. For example, in one pass one would fill the vias using metal mask, dry the metal paste (and ceramic green sheet) at elevated temperatures, such as, at 80° C. With a second pass one would screen the pattern using mesh screening and dry the paste. There may even be a third pass screening using mesh on the opposite side of the same green sheet and drying the paste. During every pass one could build an uneven paste height on the green sheet which would impact the next pass screening due to, for example, the mask not laying flat on the green sheet, etc. This could lead to paste bleed out in subsequent screening and would result in a non-manufacturable structure and process. Furthermore, the repeated screening and drying process could also make the green sheets curl and wrinkle and hence further screening or stacking of the green sheets would be very difficult.

U.S. Pat. No. 5,024,883 (SinghDeo) teaches building an MLC substrate using a serial process, and uses a thin blanket metal for conductor formation. Also taught is an etching process to etch out the area where conductor is not needed. He also teaches the hot pressing of components.

U.S. Pat. No. 5,480,503 (Casey) teaches releasably-supporting the thin green sheets on a temporary carrier support having an ablatable release layer over a patterned conductive layer, and filling the vias with conductive metal paste, whereby the thin green sheets are supported against warpage and distortion. The supported green sheets are formed as single layers, pairs and stacks thereof, and separated from temporary support for use. The suggested temporary support is a glass plate. The metallization technique is CVD type plating and in the process has to use non-ablatable and ablatable films on the green sheet.

U.S. Pat. No. 5,502,013 (James) addresses a method to form a smooth and flat sintered ceramic surface. Here a greenware precursor is added on a greenware base surface and in sintering a smooth surface is achieved.

U.S. Pat. No. 5,534,092 (Ogawa) teaches the use of two step lamination of stacked green sheets in order to suppress deviation of conductor films and to effectively remove voids by using a modified lamination punch.

PURPOSES AND SUMMARY OF THE INVENTION

This invention is a novel method and an apparatus for forming buried metal features with flat surface in single and laminated unfired structures.

Therefore, one purpose of this invention is to provide an apparatus and a method that will produce metallized green sheets where the metallurgy is buried and has smooth and flat features.

Another purpose of this invention is to provide for an apparatus and a method that will ensure multiple pass screening on a layer in a multilayer ceramic package.

Still another purpose of this invention is to have an apparatus and a method to eliminate entrapment of debris during lamination due in part to the surface roughness of the screened features. The debris could include the surface cover layer which may be a non-metallic phase. The entrapped non-metallic debris in the surface metal features usually causes problem in plating and bond and assembly.

Yet another purpose of this invention is to have an apparatus and a method to do double sided screening to form multilayer ceramic packages.

Still yet another purpose of the invention is to have an apparatus and a method with flat surface metal features in cavity type packages where the metal features are inside the cavity and post sinter bond and assembly processes warrant flat and smooth metal topography.

Still another purpose of the present invention is to have an apparatus and a method that will ensure no damage to metal features during the process of burying the metal features and/or flattening the metal features by providing inventive material set.

Therefore, in one aspect this invention comprises a green sheet comprising at least one via hole with a sidewall, wherein said at least one via hole has at least one material that penetrates at least a portion of said sidewall of said via hole.

In another aspect this invention comprises a process for flattening at least one feature in at least one green sheet, comprising the steps of:
(a) placing said at least one green sheet on a flat surface,
(b) applying pressure on at least a portion of said protruding feature, such that at least a portion of said protruding feature is pressed into said green sheet.

In yet another aspect this invention comprises an apparatus for flattening at least one feature protruding from at least one green sheet, comprising:
(a) at least one flat surface for accommodating said at least one green sheet,
(b) at least one means for applying pressure on at least a portion of said protruding portion such that at least a portion of said protruding portion is pressed inside said green sheet.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows taken in conjunction with the accompanying drawings in which:

DETAILED DESCRIPTION OF THE INVENTION

Basically, the invention is a novel apparatus and method where a green sheet, which has been punched and screened, is sandwiched between one or more thermoplastic sheets, such as, for example, silicone coated thermoplastic sheets, and compressed uniaxially at an elevated temperature and cooled before a conventional stacking operation in MLC packaging manufacture.

This invention also enables the multipass and double sided screening of ceramic green sheets that initially may have had to be discarded, and which now have surface metal features that are flat and smooth for post sinter operations, like bond and assembly.

Additionally, this invention enables metal features buried in ceramic for enhanced electrical performance in MLC packages.

Figure 1:
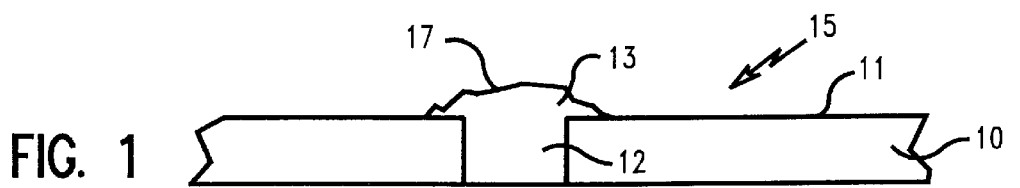
FIG. 1, illustrates a typical punched and screened green sheet.

FIG. 1, illustrates a punched and screened substrate 15. The substrate 15, basically comprises of at least one ceramic green sheet 10, that may have at least one opening or via hole 12, having smooth straight sidewalls 18. The via 12, could be a through via 12, or a blind via 12, similar to the one shown in FIG. 10. The via 12, would normally have via material 13. The via material 13, could be formed by a number of ways which are well known to a person skilled in the art, such as, for example, by CVD, electro-plating, electroless plating, PECVD, plating, screening, to name a few.

It is preferred that the material for the unfired or green sheet 10, be selected from a group comprising aluminum nitride, ceramic, glass, glass-ceramic material, to name a few.

As shown in FIG. 1, portions of the material 13, are inside the via hole 12, however, portions of the material 13, are outside the opening 12, and those portions 17, create at least one cap 17, or line 17, or protrusion 17, that is above the surface 11, of the green sheet 10. For most prior art applications, this protrusion 17, did not create a problem because of a number of reasons, such as, for example, the layers that the substrate 15, would be associated with were thick enough and with features big enough to accept these "surface roughness", etc., or that it was desired to have this protrusion 17. However, for thinner or finer feature green sheets 10, it is desired that this protrusion 17, be almost or substantially coplanar with the surface 11, of the green sheet 10.

It is preferred that the material for the cap, line or via 17, be selected from a group comprising copper, lead, molybdenum, solder, tin, tungsten and alloys thereof, to name a few.

Figure 2:
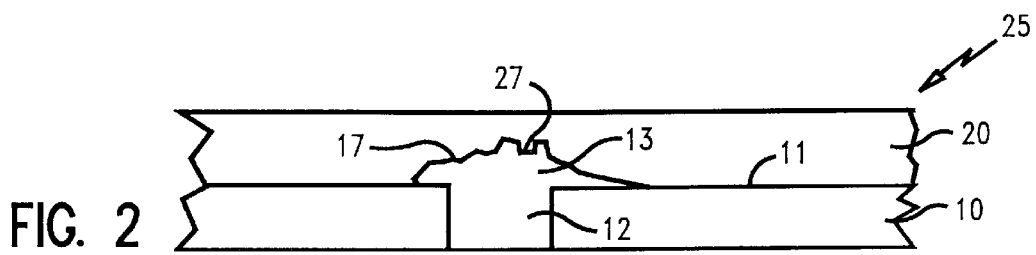
FIG. 2, illustrates one problem that can arise from a punched, screened and laminated green sheet having at least one protruding feature.

FIG. 2, illustrates one problem that can arise from using a punched, screened and laminated green sheet 25, having at least one protruding feature 17. When the green sheet 10, is associated or secured to another or second sheet or layer 20, the protrusion 17, penetrates and creates a surface crevice 27, inside the second layer 20. For some applications the second sheet 20, could be at least one blank non-sinterable surface layer to help facilitate zero X-Y shrinkage when laminated to at least one such sinterable ceramic layer 10, to form a laminate 25. During lamination the screened features and the ceramic green sheet typically get compressed usually by an uniaxial lamination force and the thickness is reduced.

Also, during the lamination process the cluster of non-sinterable ceramic particles from the surface layer 11, gets trapped in crevices 27, which are on top of the feature 17. After sintering the non-sintered laminating layer 20, would typically be blown away to expose the screened features for post-sinter operations such as plating and bonding. It has been found that the ceramic particles in the crevices 27, of the metal features such as the via 12, leads to non-plating areas in the surface metal features and further leads to failure in pin attach, wirebond, C4, chip bonding, and other similar processes. Furthermore, if the protrusion 17, is large enough it could even protrude through a laminating or similar sheet 20.

Figure 3:
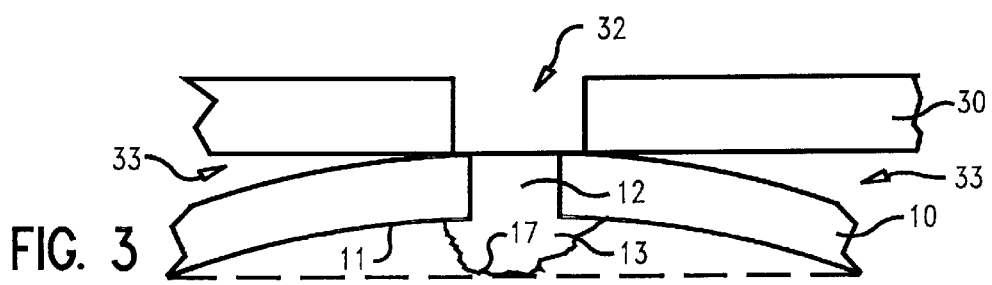
FIG. 3, illustrates another problem that can arise from a punched and screened green sheet having at least one protruding feature.

FIG. 3, illustrates another problem that can arise from using a punched and screened green sheet 15, having at least one protruding feature 17. This problem could arise when a prior art screening process is used on both sides of the screened green sheet 15. The ceramic green sheet 10, of FIG. 1, with at least one screened feature, such as, via 13, is shown to be screened with a screening mask 30, on the opposite side of the initial screened side. The screening mask 30, typically has at least one opening 32, for screening. Since the screened features 13, has a rough and/or protruding feature or surface 17, it results in the raising or bowing of the surface 11, of the green sheet 10. Because, the green sheet layer 10, does not lie flat, therefore, the screening mask 30, does not mate flush with the green sheet 10, during screening, and this distortion creates at least one gap 33. The gap 33, around the opening 32, could lead to a variety of problems, such as, for example, paste bleed out, resulting in a non-usable screened green sheet 15.

Figure 4:
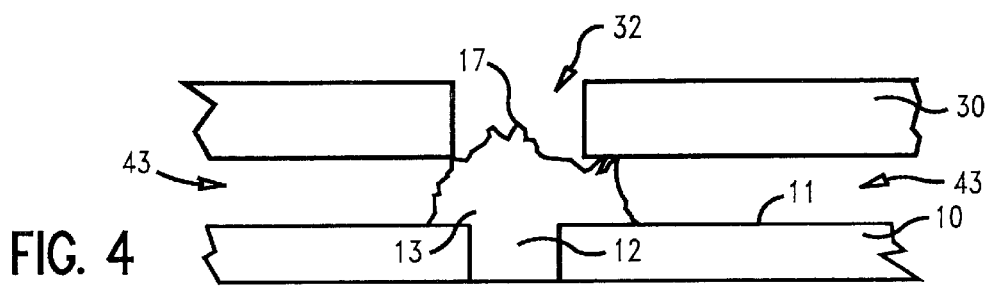
FIG. 4, illustrates yet another problem that can arise from a punched and screened green sheet having at least one protruding feature.

FIG. 4, illustrates yet another problem that can arise from using a punched and screened green sheet 15, having at least one protruding feature 17. This problem would show-up when a prior art multi-pass screening process would be used for the green sheet 15. The ceramic green sheet 15, having at least one-pass screened features 13, such as, a via 13, is shown to be screened with a screening mask 30, on the feature 13. The screening mask 30, typically has at least one opening 32, for screening. Since the screened features 13, has at least one rough and/or protruding surface or feature 17, it results in the raising of the screening mask 30, above the surface 11, of the green sheet 10, and the screening mask 30, does not mate flush with the green sheet 15, during the screening process, thus creating at least one gap 43. The gap 43, around the opening 32, could lead to a variety of problems, such as, for example, paste bleed out, resulting in a non-usable multi-pass screened green sheet 15.

Figure 5:
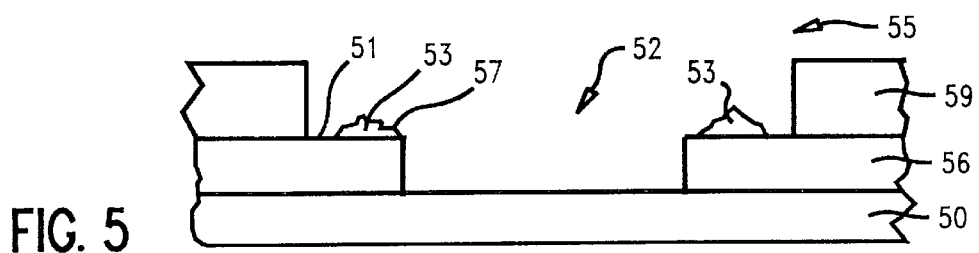
FIG. 5, illustrates a cavity substrate where at least one metal feature is protruding.

FIG. 5, illustrates a defective cavity substrate 55, where at least one metal feature 53, has become exposed and protrudes above the surface 51, in the cavity 52. The cavity product 55, could be formed by any of the prior art process, such as, for example, using a prior art insertless process. The cavity product 55, typically, has at least one base layer 50, with at least one wire bonding layer 56, that has at least one cavity or opening 52, and at least one top surface layer 59, that has at least one opening or cavity 52. Insertless cavity formation techniques may use compliant materials in contact with the screened features 53, for example, in wirebond layers 56. Since the compliant materials do not aid in burying the screened features 53, and can not flatten the rough and protruding surfaces 57, of the screened features, the cavity product 55, is difficult to run through conventional wirebond tools and thus gives poor yields in wirebond strength.

Figure 6:
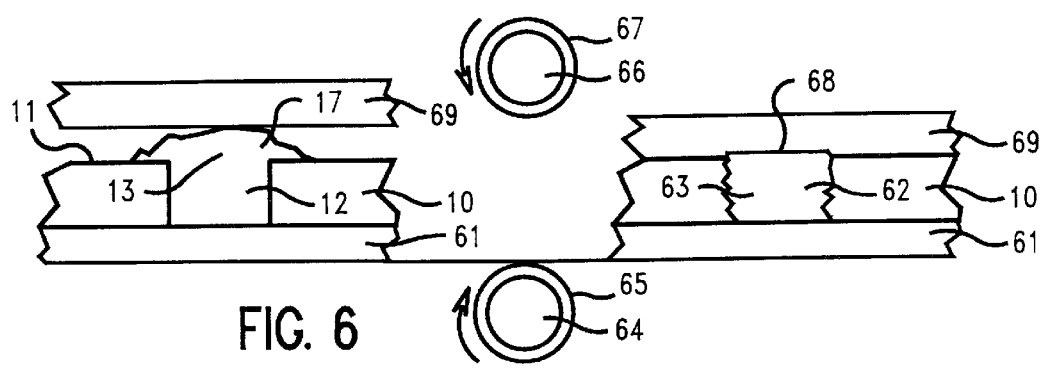
FIG. 6, illustrates one preferred apparatus to obtain partially or fully buried metallized features in a screened green sheet without damaging or distorting the structure.

FIG. 6, illustrates one preferred apparatus to obtain partially or fully buried metallized features in a screened green sheet without damaging or distorting the structure. FIG. 6, shows a punched and screened green sheet 10, with at least one cap or line or protrusion having rough and/or raised surface 17, above the green sheet surface 11. The green sheet 15, is then preferably stacked in between at least one coated polymer sheets 61 and/or 69. Preferably, the coating on the polymer sheet is fully or partially cured silicone. The coating on the sheet 61 and/or 69, itself could be only about few microns and preferably less than a mil. The polymer can be any rigid polymer and preferably is a polyester type. It is preferred that the non-sticky material that is used, such as, a silicone coated thermoplastic polymer, is of such a nature that during the compression process it avoids any and all damage to the screened or protruding features and that it also helps in burying the protruding or screened features partially or fully inside the green sheet.

Basically, the stack that would go into the compression process would normally comprise of at least one personalized green sheet 15, having at least one protruding feature 17, and at least one sheet 61 and/or 69, which are fed in between at least one roller 64 and/or 66, of a roll laminator and are pressed at the pressure range between about 5 psi and about 1000 psi and preferably at a temperature of less than about 85° C.

After the lamination the coated polymer sheet 61 and/or 69, are removed. The pressed green sheet 15, now has vias, caps and/or lines 62, completely or partially buried in the green sheet 10, and the caps and lines have a flat surface 68, which is either coplanar or substantially coplanar with the surface 11, of the green sheet 10. This lamination or pressing of the portion 17, into the via opening 12, forces the puncture or penetration into the smooth straight sidewalls 18, of the portion 17, and thus creating irregular jagged sidewalls 78, as more clearly seen in FIG. 7.

It should also be appreciated that for some applications the rollers 64 and/or 66, could also have at least one layer of at least one non-sticky material 65 and 67, respectively. The layer of non-sticky material 65 and/or 67, could be made from the same material as material 61 and/or 69, or it could be different.

One advantage of having the sheet or layer 61, 64, 66 and/or 69, such as, a silicone coated thermoplastic sheet, in the apparatus of FIG. 6, is also to prevent any damage to the feature 17, during the compression process.

Additionally, the sheet or layer 61, 64, 66 and/or 69, such as, a rigid thermoplastic base, also helps in burying the protruding feature 17, fully or partially into the green sheet 10.

Figure 7:
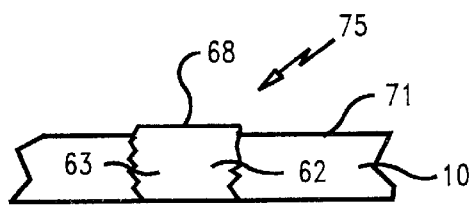
FIG. 7, illustrates an enhanced green sheet using the inventive method, material and apparatus of this invention.

FIG. 7, illustrates an enhanced green sheet 75, using the inventive method, material and apparatus of this invention, where the green sheet 10, now has a via 62, which accommodates via material 63, and has a surface 68, which is preferably substantially coplanar with the surface of the green sheet 10. Of course it is preferred that the surface 68, is pretty much flush with the surface 71, however, in most applications it may not matter even if the surface 68, is slightly above the surface 11, and is not fully coplanar. As can be clearly, seen in FIG. 7, that the via 12, has expanded into via 62, to pretty much accommodate the via material 13 and 17, to create the via material layer 63. Of course care should be taken that each of the vias 62, are isolated from each other, otherwise one could get shorts or maybe crosstalk, etc.

Figure 8:
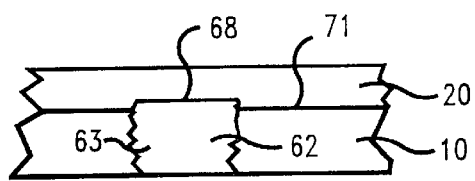
FIG. 8, illustrates a laminated structure using the enhanced green sheet of this invention.

FIG. 8, illustrates a laminated structure using the enhanced green sheet 75, of this invention. The ceramic green sheet 10, with at least a screened via hole 12, is subjected to the method, material and apparatus of this invention, hence the cap 17, or the lines 17, or the protrusion 17, lay flat and fully or partially buried in the green sheet 10, creating the flat surface 68, for the embedded feature 63. Now, a second layer 20, such as, for example, a blank non-sinterable surface layer to help facilitate zero X-Y shrinkage could be laminated to at least one such sinterable ceramic layer 75, to form a laminate. In lamination the screened features and the green sheets get compressed usually by uniaxial lamination force and the thickness is reduced. It was discovered that during the lamination process there was no trapping of non-sinterable ceramic particles from the surface 68, 71, in the embedded caps, lines and/or protrusions 63, as the surface 68, is now smooth due to the process and apparatus of this invention. After sintering the non-sintered surface layer 20, would normally be blown away to expose the screened features for post-sinter operations, such as, plating, bonding etc. It was found that the non-existence of the ceramic particles in the embedded caps, lines and/or protrusions 63, enhances the plating yield. This enhancement in the plating yield in turn improves the bond strength and yield in pin attach, wirebond, C4 and chip bonding, etc.

Figure 9:
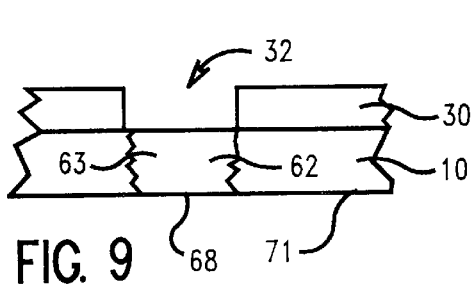
FIG. 9, illustrates another embodiment which has resulted from the inventive method, material and apparatus of this invention.

FIG. 9, illustrates another embodiment which has resulted from the inventive method, material and apparatus of this invention. FIG. 9, shows the screening process on both sides using the enhanced green sheet 75. The ceramic green sheet 10, with one side screened features like via and caps and lines 17, was subjected to the process, material and apparatus of this invention. The enhanced green sheet 75, to be screened with a screening mask 30, on the opposite side to the screened side. The screening mask 30, has openings 32, for screening. Since the embedded screened features 63, have a flat surface 68, that are partially or fully buried in the green sheet 10, the green sheet layer 10, lies flat and therefore the screening mask 30, mates flush with the green sheet 10, during screening. Additionally, the absence of any gap 33, around the opening 32, also leads to good pattern definition.

Figure 10:
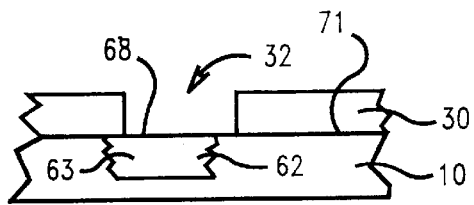
FIG. 10, illustrates yet another embodiment that has resulted from the inventive method, material and apparatus of this invention.

FIG. 10, illustrates yet another embodiment that has resulted from the inventive method and apparatus of this invention. FIG. 10, shows a multi-pass screening process for a green sheet 10. The ceramic green sheet 10, with at least one-pass screened feature, such as, a via, and/or a cap and/or a lines 17, was subjected to the process and apparatus of this invention. A screening mask 30, having at least one opening 32, for screening was placed above the embedded line and/or via and/or cap 63. Since the screened features 63, have a flat surface 68, and are partially or fully buried in the green sheet 75, the mask 30, mates flush with the green sheet 75, during screening. Furthermore, the absence of any gap 43, around the opening 32, also leads to a good pattern definition and good yield. However, it should be noted that the embedded feature 63, could have been a feature on the surface 71, of the green sheet 10, and upon embedding by the apparatus of this invention created the blind via 62.

Figure 11:
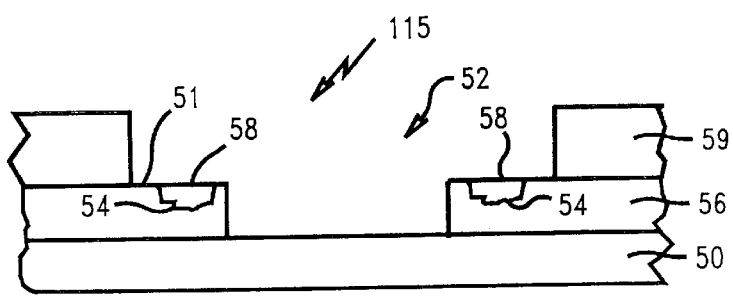
FIG. 11, illustrates still another embodiment that has resulted from the inventive method, material and apparatus of this invention.

FIG. 11, illustrates still another embodiment that has resulted from the inventive method, material and apparatus of this invention. FIG. 11, shows a cavity product 115, formed using an insertless process. Insertless cavity formation techniques may use compliant materials in contact with the screened features 53, which was subjected to the process, material and apparatus for example in the wirebond layers 57. Even though the compliant materials may not aid in fully burying the screened feature 54, the screened features 54, have flat surfaces 58, and are partially or fully buried in the green sheet 57, creating a jagged region 88, that has irregular jagged edges, and wherein the jagged region 88, was created after feature 53, had punctured or penetrated the surface 51, to create feature 54. After this embedding or flattening of the protrusion 53, the cavity product 115, can now easily be run through conventional wirebond tools and gives good wirebond yield and strength due to more surface area for bonding, etc.

As discussed earlier, one method of forming the unsintered ceramic structure of this invention would be to do at least one screening pass on at least on one side in the green sheet. The next step could be placing at least one sheet, such as, for example, a silicone coated thermoplastic polymer sheet, on either side of the screened green sheet. The green sheet would then be compressed in between at least two platens using heat and/or pressure. After the desired flatness for the screened feature has been obtained the silicone coated thermoplastic sheets would then be separated from the pressed green sheet. Of course, for most of the green sheet layer this process could be repeated so that the number of green sheets needed to build a substructure are obtained.

For most applications the screened structure that is obtained would have at least one punched and screened green sheet layer which would have a minimal distortion and the metal features would of course be partially or fully buried in the green sheet.

It is preferred that the non-sticking material 61 and/or 65, and/or 67 and/or 69, be selected from a group comprising Kapton, polyester, polymer, polyurethane, silicones and polymers containing boron nitride or magnesium silicate, to name few. However, this non-sticky material should be of sufficient strength, so as not to allow the penetration from the protruding feature 17, and subsequent rupturing or degradation of the non-sticking material.

EXAMPLES

The following examples are intended to further illustrate the invention and are not intended to limit the scope of the invention in any manner.

Example 1

Several samples of multilayer ceramic laminates containing glass ceramic green sheets of thicknesses varying from about 6 mils to about 8 mils with copper based vias and caps and a cover sheet of type alumina were built using the method and apparatus of this invention. The process and apparatus illustrated in FIG. 6, was used to partially or fully bury the screened features into the glass ceramic layer. The coated polymer layer was a polyester with silicone coating. Subsequent to sintering of the laminate, the alumina layer was removed and the exposed metal patterns were found to be free of any trapped alumina particles.

Example 2

Several single green sheets with thicknesses ranging from about 3 mils to about 20 mils were punched and screened double sided as illustrated in FIG. 8, and using the process and apparatus as illustrated in FIG. 6. The material set for the green sheet included alumina and glass ceramic and the metal paste included molybdenum and copper and composites. In all cases it was found that there was no paste bleed out and this resulted in good pattern definition. The protruding features on one side were buried at pressures of up to about 700 psi and at temperatures of less than about 85° C. The coated polymer used was a silicone coated polyester.

Example 3

Several single green sheets with thicknesses ranging from about 3 mils to about 20 mils were punched and screened multi-pass as illustrated in FIG. 9, and using the process and apparatus as illustrated in FIG. 6. The material set for the green sheet included alumina and glass ceramic and the metal paste included molybdenum and copper and composites. In all cases it was found that there was no paste bleed out and this resulted in good pattern definition. The one pass protruding features were buried at pressures of up to about 700 psi at temperatures of less than about 85° C. The coated polymer used was a silicone coated polyester.

Example 4

Several cavity products were made using insertless lamination process as illustrated in FIGS. 5 and 11, and using the process and apparatus as illustrated in FIG. 6, for wirebond layers. The material set for the green sheet included alumina. In all cases it was found that the wirebond pads were buried in the ceramic layer and a flat with more bonding surface was obtained. The wirebond strength was observed to be at least 20 percent higher than that obtained from prior art. More significantly the wirebond strength standard deviation was very narrow and thus resulted in a more reliable and repeatable process.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A green sheet comprising at least one via hole with a sidewall, wherein said at least one via hole has at least one material that has a plurality of irregular jagged penetrations in at least a portion of said sidewall of said via hole.

2. The green sheet of claim 1, wherein said green sheet is selected from a group consisting of aluminum nitride, ceramic, glass and glass-ceramic material.

3. The green sheet of claim 1, wherein said at least one material that penetrates at least a portion of said sidewall of said via hole is selected from a group consisting of copper, lead, molybdenum, solder, tin, tungsten and alloys thereof.

4. The green sheet of claim 1, wherein at least a portion of the surface of said at least one material that penetrates at least a portion of said sidewall of said via hole and said at least one green sheet are substantially coplanar.

5. The green sheet of claim 1, wherein said least one material that penetrates at least a portion of said sidewall of said via hole is a line or a cap.

6. A green sheet having a first surface, wherein at least a portion of said first surface has least one material that has a plurality of jagged edges that penetrate said first surface and are embedded therein.

7. The green sheet of claim 6, wherein said green sheet is selected from a group consisting of aluminum nitride, ceramic, glass and glass-ceramic material.

8. The green sheet of claim 6, wherein said at least one material that penetrates at least a portion of said first surface is selected from a group consisting of copper, lead, molybdenum, solder, tin, tungsten and alloys thereof.

9. The green sheet of claim 6, wherein at least a portion of the surface of said at least one material that penetrates at least a portion of said first surface of said at least one green sheet are substantially coplanar.

10. The green sheet of claim 6, wherein said least one material that penetrates at least a portion of said first surface is a line or a cap.

11. The green sheet of claim 6, wherein said first surface has at least one opening to accommodate at least a portion of said at least one material that penetrates at least a portion of said first surface.

12. The green sheet of claim 6, wherein said green sheet is a part of a cavity substrate.

\* \* \* \* \*